United States Patent
Asano

(10) Patent No.: US 9,565,781 B2
(45) Date of Patent: Feb. 7, 2017

(54) HOLDING APPARATUS THAT HOLDS ELECTRONIC APPARATUS

(71) Applicant: Panasonic Intellectual Property Management Co., Ltd., Osaka (JP)

(72) Inventor: Hiroki Asano, Osaka (JP)

(73) Assignee: Panasonic Intellectual Property Mangement Co., Ltd., Osaka (JP)

( * ) Notice: Subject to any disclaimer, the term of this patent is extended or adjusted under 35 U.S.C. 154(b) by 0 days.

(21) Appl. No.: 14/796,423

(22) Filed: Jul. 10, 2015

(65) Prior Publication Data

US 2015/0319871 A1 Nov. 5, 2015

Related U.S. Application Data

(63) Continuation of application No. PCT/JP2014/000158, filed on Jan. 15, 2014.

(30) Foreign Application Priority Data

Jan. 15, 2013 (JP) .................................. 2013-004246

(51) Int. Cl.
*E04G 3/00* (2006.01)
*H05K 5/02* (2006.01)
(Continued)

(52) U.S. Cl.
CPC .......... *H05K 5/0204* (2013.01); *F16M 11/105* (2013.01); *F16M 11/2078* (2013.01);
(Continued)

(58) Field of Classification Search
CPC  H05K 5/0204; F16M 11/105; F16M 11/2078; F16M 13/022; F16M 13/04; F16M 2200/022; F16M 11/046; F16M 11/04; F16M 11/2064; F16M 11/2071; F16M 11/2057; F16M 11/2035; F16M 11/2014; F16M 11/2021; H04N 5/2252
(Continued)

(56) References Cited

U.S. PATENT DOCUMENTS 8,727,192 B2 * 5/2014 Lai ..................... B60R 11/0241
224/282
9,309,012 B1 * 4/2016 Kilgore ................ G03B 17/561
(Continued)

FOREIGN PATENT DOCUMENTS

JP    7-6598 U    1/1995
JP    3046140 U   12/1997
(Continued)

OTHER PUBLICATIONS

International Search Report for corresponding International Application No. PCT/JP2014/000158 mailed Feb. 18, 2014.
(Continued)

*Primary Examiner* — Christopher E Garft
(74) *Attorney, Agent, or Firm* — Renner, Otto, Boisselle & Sklar, LLP

(57) ABSTRACT

A holding apparatus includes a holding member that holds an electronic apparatus, a supporting member that is connected to the holding member and supports the holding member, and a first pushing member and a second pushing member which are disposed between the holding member and the supporting member. When the first pushing member is handled by the user, the first pushing member pushes the second pushing member in the first direction toward the holding member, and pushes the holding member in the second direction toward the supporting member and opposite to the first direction.

6 Claims, 9 Drawing Sheets

(51) Int. Cl.
*F16M 13/02* (2006.01)
*H04N 5/225* (2006.01)
*F16M 11/10* (2006.01)
*F16M 11/20* (2006.01)
*F16M 13/04* (2006.01)

(52) U.S. Cl.
CPC .......... *F16M 13/022* (2013.01); *F16M 13/04* (2013.01); *H04N 5/2252* (2013.01); *F16M 2200/022* (2013.01)

(58) Field of Classification Search
USPC ....... 248/482, 181.1, 181.2, 481; 361/679.03
See application file for complete search history.

(56) References Cited

U.S. PATENT DOCUMENTS

| | | | | |
|---|---|---|---|---|
| 2007/0152115 A1* | 7/2007 | Chou | ..................... | F16M 11/14 248/181.1 |
| 2007/0152116 A1* | 7/2007 | Madsen | ................. | F16M 11/14 248/181.1 |
| 2008/0124069 A1 | 5/2008 | Basho | | |
| 2013/0270317 A1* | 10/2013 | Wang | ..................... | B60R 11/02 224/570 |
| 2014/0375874 A1* | 12/2014 | Asano | .................. | H04N 5/2252 348/373 |

FOREIGN PATENT DOCUMENTS

| | | |
|---|---|---|
| JP | 10-276387 A | 10/1998 |
| JP | 2002-339948 A | 11/2002 |
| JP | 2008-141233 A | 6/2008 |
| JP | 2008-152242 A | 7/2008 |
| JP | 2011-193268 A | 9/2011 |
| JP | 2011-221357 A | 11/2011 |

OTHER PUBLICATIONS

International Preliminary Report on Patentability for corresponding International Application No. PCT/JP2014/000158 issued Jul. 21, 2015.

* cited by examiner

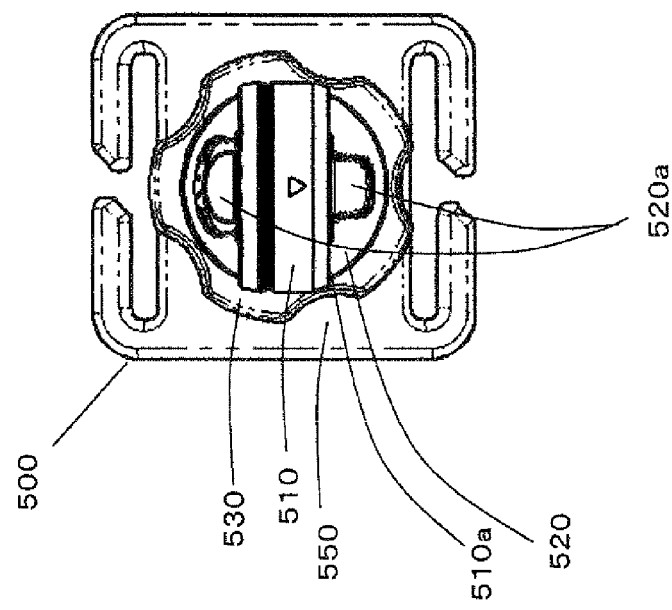
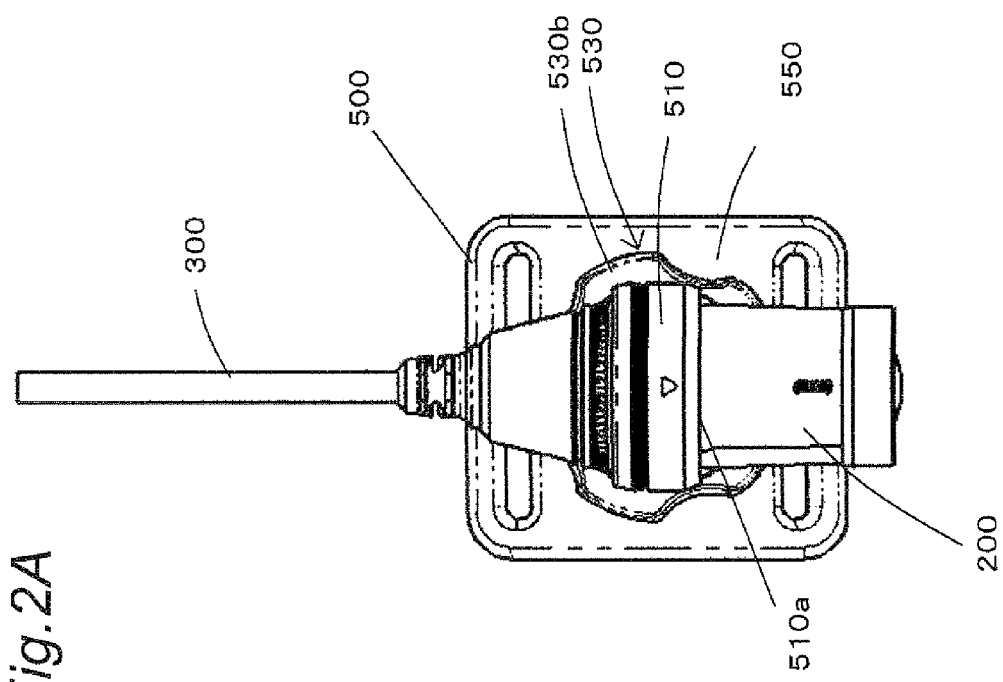

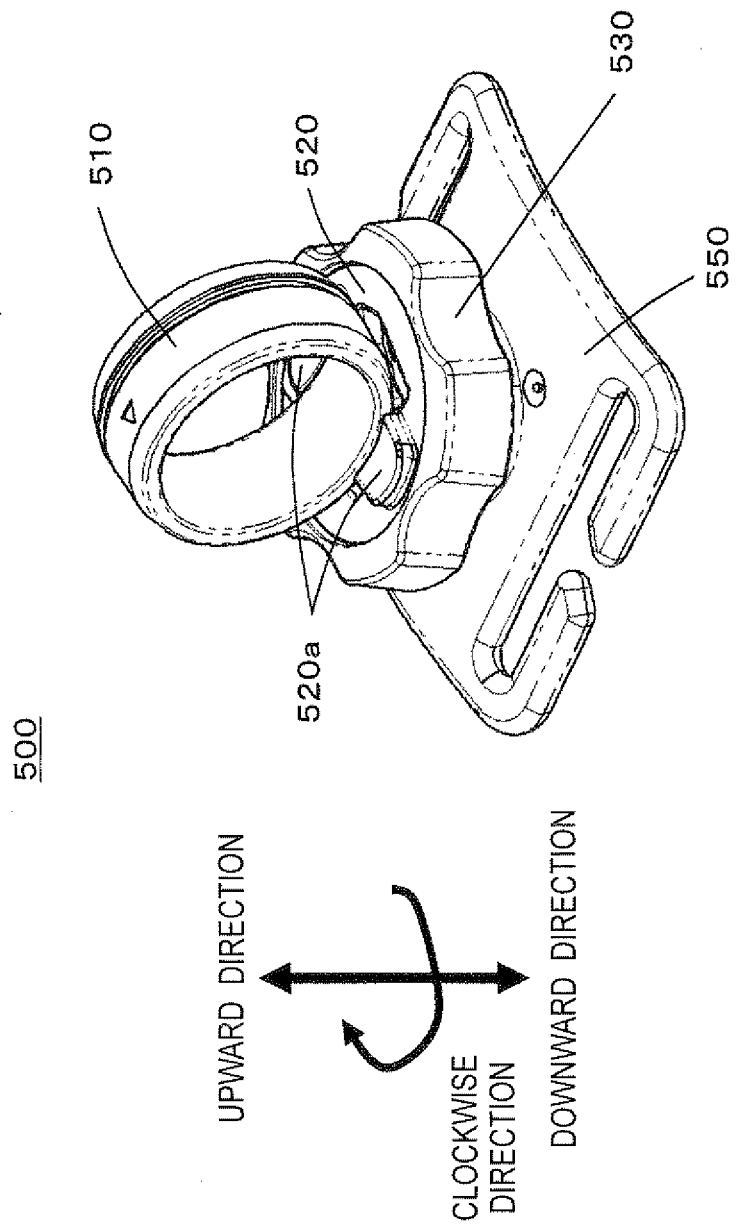

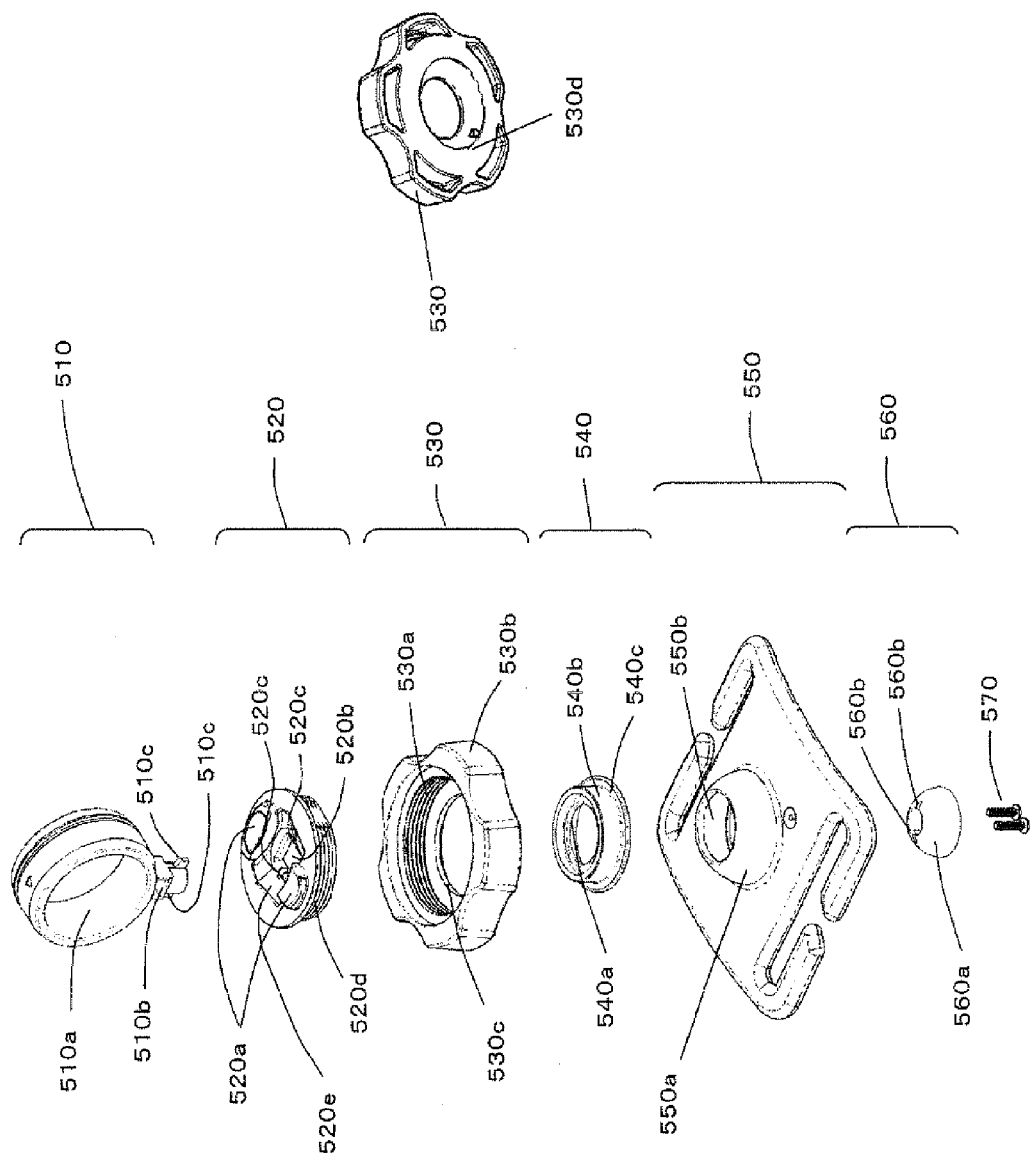

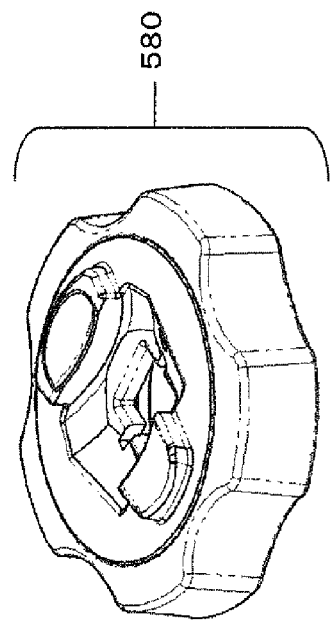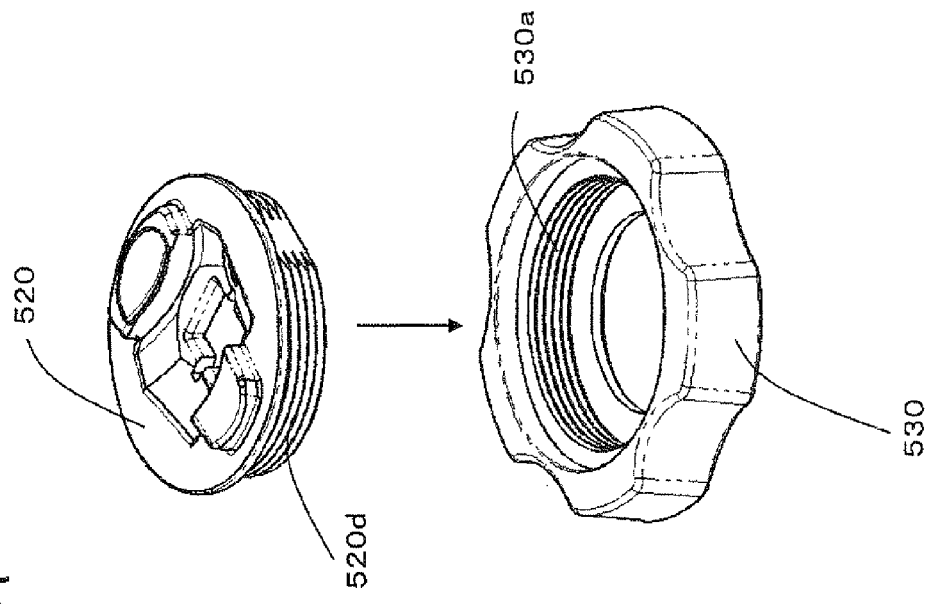

HOLDING APPARATUS THAT HOLDS ELECTRONIC APPARATUS

CROSS-REFERENCE TO RELATED APPLICATIONS

This is a continuation application of International Application No. PCT/JP2014/000158, with an international filing date of Jan. 15, 2014, which claims priority of Japanese Patent Application No. 2013-004246 filed on Jan. 15, 2013, the content of which is incorporated herein by reference.

BACKGROUND

1. Technical Field

This disclosure relates to a holding apparatus that holds an electronic apparatus, etc.

2. Description of Related Art

Japanese Patent Laid-Open Publication No. 2008-152242 discloses a method for simultaneously fixing a first spherical body and a second spherical body by tightening a male screw member into a joint unit, the first spherical body being located close to a coupling device and the second spherical body being located close to a suction cup device.

SUMMARY

This disclosure provides a holding apparatus that easily holds an electronic apparatus, etc., and that is capable of being configured with a reduced size.

A holding apparatus of a general aspect of this disclosure is provided with: a holding member that holds the electronic apparatus; a supporting member that is connected to the holding member and supports the holding member; and a first pushing member and a second pushing member which are disposed between the holding member and the supporting member. When the first pushing member is handled by a user, the first pushing member pushes the second pushing member in a first direction toward the holding member, and the first pushing member pushes the first pushing member itself in a second direction toward the supporting member and opposite to the first direction.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

According to this disclosure, it is possible to provide the holding apparatus capable of easily holding an electronic apparatus, etc., and capable of being configured with a reduced size.

BRIEF DESCRIPTION OF DRAWINGS

FIG. 2A is a diagram of a camera holding unit 500 seen from above;

FIG. 2B is a diagram of a camera holding unit 500 seen from above;

FIG. 3 is a perspective diagram of the overall camera holding unit 500;

FIG. 4 is an exploded perspective diagram of members constituting the camera holding unit 500;

FIG. 5A is a diagram illustrating assembly of a holding nut unit 580;

FIG. 5B is a diagram illustrating assembly of a holding nut unit 580;

DETAILED DESCRIPTION

[1. Configuration of Wearable Camera Unit]

Figure 1:
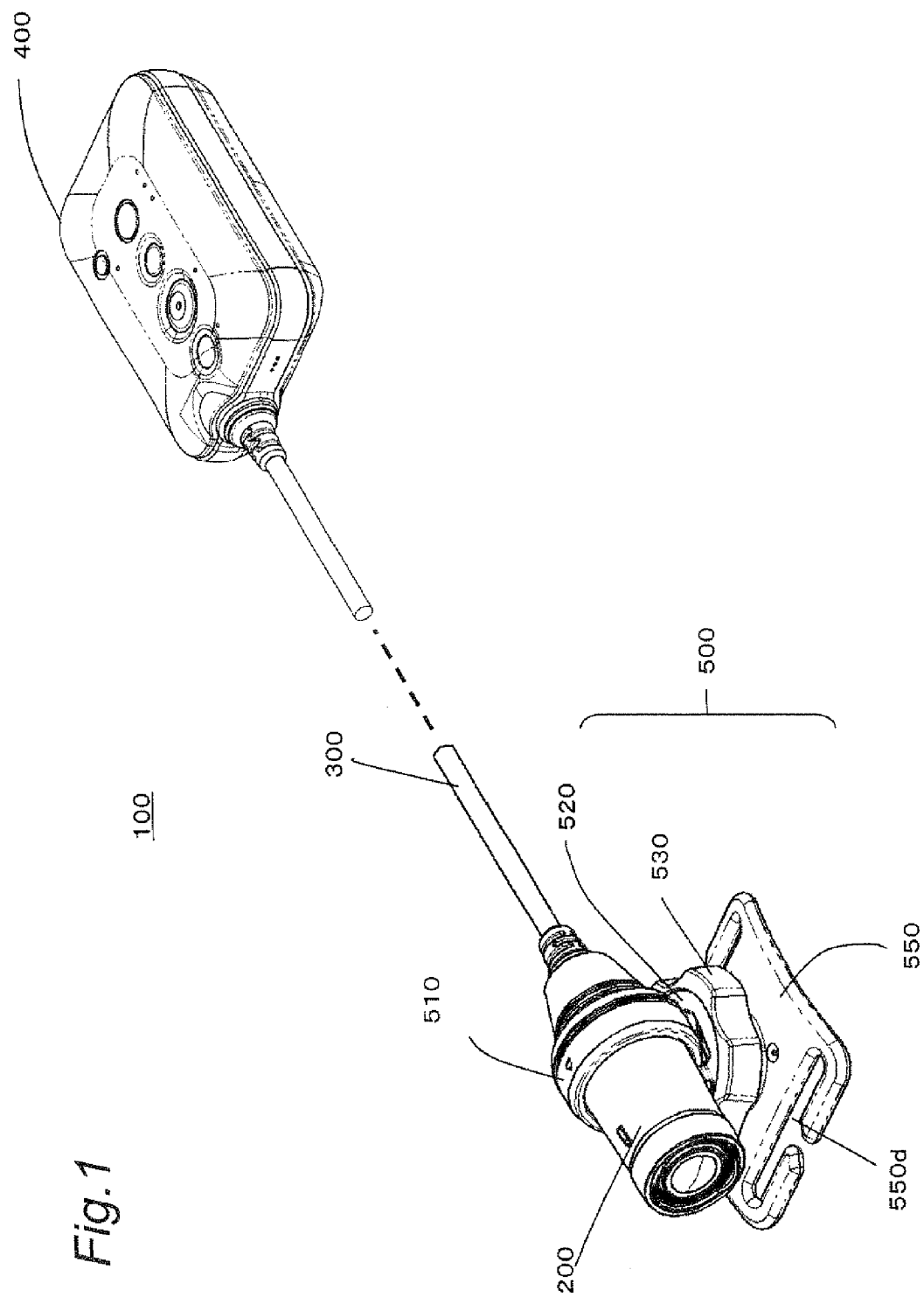
FIG. 1 is a diagram illustrating an overall configuration of a wearable camera unit 100.

A configuration of a wearable camera unit 100 will be described with reference to FIG. 1. FIG. 1 is a diagram of the overall wearable camera unit 100. The wearable camera unit 100 includes a camera unit 200, a cable 300, a console unit 400, and a camera holding unit 500.

The camera unit 200 includes an optical system, an imaging sensor, a microphone, etc., and is a unit for capturing images and recording sounds. The cable 300 is a member for electrically connecting the camera unit 200 and the console unit 400 to each other for communication therebetween. The console unit 400 is a unit for operating the camera unit 200 through the cable 300. The console unit 400 is a unit including a recording medium to record image data captured and produced by the camera unit 200. The camera holding unit 500 is a unit for holding the camera unit 200. The camera holding unit 500 includes a belt insert portion 550d, i.e., an opening through which a belt member is inserted. A user can capture images using the camera unit 200 attached to a portion of the user's body or clothes, by attaching the belt member inserted through the belt insert portion 550d, to an arbitrary position of the user's body or clothes. The camera holding unit 500 enables the angle of the camera unit 200 to be freely adjusted (the details thereof will be described later).

[2. Configuration of Camera Holding Unit]

A configuration of the camera holding unit 500 will be described with reference to FIGS. 2A and 2B. FIGS. 2A and 2B is a diagram of the camera holding unit 500 seen from above. FIG. 2A shows the camera holding unit 500 to which the camera unit 200 is attached, and FIG. 2B shows the camera holding unit 500 to which the camera unit 200 is not attached.

As shown in FIGS. 2A and 2B, the camera holding unit 500 includes a holding ring 510, a holding washer top 520, a holding nut 530, and a holding base 550.

The holding ring 510 has a camera mount portion 510a in the inside. The camera mount portion 510a is a surface with which the camera unit 200 contacts when the camera unit 200 is attached to the holding ring 510.

The holding washer top 520 has camera contact surfaces 520a. The camera contact surfaces 520a are surfaces with which the camera unit 200 contacts when the camera unit 200 is attached to the holding ring 510. The camera contact surfaces 520a are concaved based on the curvature around the camera unit 200 so as to easily hold the camera unit 200.

The holding nut 530 has a handling portion 530b. The handling portion 530b is a portion for a user to grip when the holding nut 530 is rotated. When the camera unit 200 is attached to the camera holding unit 500, it is possible to change whether or not to limit the position of the camera unit 200, by rotating the holding nut 530 around the holding washer top 520. The detailed mechanism thereof will be described later.

The holding base 550 has the belt insert portion 550d. The belt insert portion 550d has a shape for inserting the belt member. The camera holding unit 500 can be fixed to an arbitrary position, by fixing the belt member inserted through the belt insert portion 550d, to the arbitrary position.

The constituent members of the camera holding unit 500 will be described with reference to FIG. 3 and FIG. 4. FIG. 3 is a perspective diagram of the overall camera holding unit 500. In the following description, a direction in which the holding ring 510 is positioned relative to the holding base 530 will be referred to as "upward direction", and the direction opposite thereto will be referred to as "downward direction", as shown in FIG. 3. A clockwise rotation direction for the camera holding unit seen from above will be referred to as "clockwise direction".

As shown in FIG. 4, the camera holding unit 500 includes the holding ring 510, the holding washer top 520, the holding nut 530, a holding washer bottom 540, the holding base 550, a holding ball 560, and screws 570.

The holding ring 510 has the camera mount portion 510a, a rotation stopper shaped portion 510b, and protrusions 510c. The camera mount portion 510a is a surface located inside the holding ring 510, and with which the camera unit 200 contacts when the camera unit 200 is attached to the holding ring 510. The rotation stopper shaped portion 510b is shaped as a block located below the ring shaped portion of the holding ring 510. The protrusions 510c are shaped as a pair of protrusions. The protrusions 510c are formed on both opposite sides of a support extending below the rotation stopper shaped portion.

The holding washer top 520 has the camera contact surfaces 520a, a rotation stopper hole 520b, notches 520c, ring receiver portions 520e, and a male screw 520d. As described above, the camera contact surfaces 520a are the surfaces with which the camera unit 200 contacts when the camera unit 200 is attached to the holding ring 510. The rotation stopper hole 520b is a hole opened around the center of the holding washer top 520, and into which the rotation stopper shaped portion 510b of the holding ring 510 is fitted. The notches 520c are a pair of notches. The notches 520c are formed at both opposite edges of the rotation stopper hole 520b. The notches 520c are formed such that the protrusions 510c of the holding ring 510 pass through, respectively. The ring receiver portions 520e are concaved regions formed at both opposite edges of the rotation stopper hole 520b. The ring receiver portions 520e receive the ring shaped portion of the holding ring 510 when the holding ring 510 is assembled to the holding washer top 520. The male screw 520d is a screw formed on an outer surface of the holding washer top 520, and to be inserted into a female screw 530a of the holding nut 530 described later.

The holding nut 530 has the female screw 530a, the handling portion 530b, a vertical wall 530c, and a rib contact surface 530d. The female screw 530a is a screw formed on an inner surface of the holding nut 530, and receiving the male screw 520d of the holding washer top 520. The vertical wall 530c contacts with a vertical wall 540b of the holding washer bottom 540 described later. The rib contact surface 530d is formed on a bottom surface of the holding nut 530 and around the opening.

The holding washer bottom 540 has an angle adjustment surface 540a, the vertical wall 540b, and a rib 540c. The angle adjustment surface 540a is a curved surface formed on a bottom surface of the holding washer bottom 540, and contacts with an angle adjustment surface 550a of the holding base described later. The vertical wall 540b is an outer surface of the holding washer bottom 540, and contacts with the vertical wall 530c of the holding out 530. The rib 540c is a flange region formed at the lower portion of the holding washer bottom 540, and contacts with the rib contact surface 530d of the holding nut 530.

The holding base 550 has the angle adjustment surface 550a and an angle adjustment surface 550b, with which the inclination of the holding ring 510 is adjusted. The angle adjustment surface 550a is an outer surface of a domed portion at the center of the holding base 550, and contacts with the angle adjustment surface 540a of the holding washer bottom 540. The angle adjustment surface 550b is an inner surface of the domed portion at the center of the holding base 550, and contacts with an angle adjustment surface 560a of the holding ball 560 described later.

The holding ball 560 has the angle adjustment surface 560a and notches 560b. The angle adjustment surface 560a is an outer surface of the holding ball 560, and contacts with the angle adjustment surface 550b of the holding base 550. The notches 560b have a pair of cutout shapes. The notches 560b are formed such that the protrusions 510c of the holding ring 510 pass through, respectively.

The holding washer top 520 and the holding nut 530 are configured to slide over and beyond, the holding nut 530 and the holding washer bottom 540 are configured to slide over and beyond, the holing washer bottom 540 and the holding base 550 are configured to slide over and beyond, and the holding base 550 and the holding ball 560 are configured to slide over and beyond. Problems such as noises are prevented by using different materials for components sliding over and beyond.

POM (polyacetal) may be used for the holding washer top 520, the holding washer bottom 540, and the holding ball 560. PC-ABS (polycarbonate-ABS) may be used for the holding ring 510 and the holding base 550. PBT may be used for the holding nut 530.

[3. Assembly of Camera Holding Unit]

A flow of assembly of the camera holding unit will be described with reference to FIG. 5A to FIG. 7B.

FIGS. 5A and 5B is a diagram illustrating assembly of a holding nut unit 580. FIG. 5A is a diagram illustrating a flow of assembly of the holding washer top 520 and the holding nut 530. The male screw 520a of the holding washer top 520 is tightened into the female screw 530a of the holding nut 530 through clockwise rotation, and thus, the male screw 520a is fitted and fixed into the female screw 530a. Accordingly, as shown in FIG. 5B, the holding nut unit 580 is made as a unit formed by assembling the holding washer top 520 to the holding nut 530.

Figure 6B:
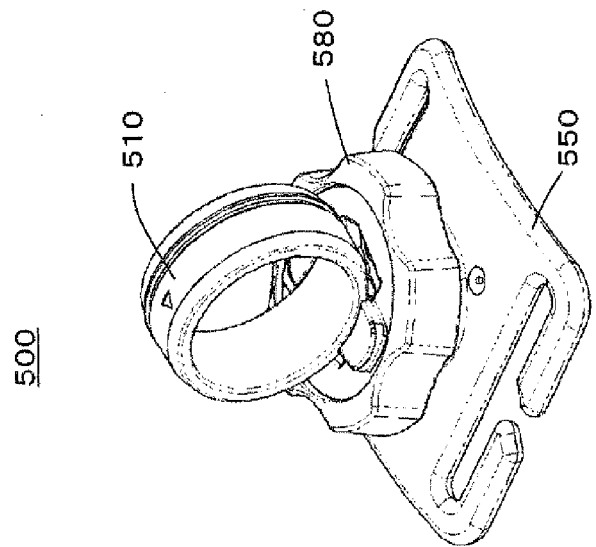
FIG. 6B is a diagram illustrating assembly of the camera holding unit 500.
Figure 6A:
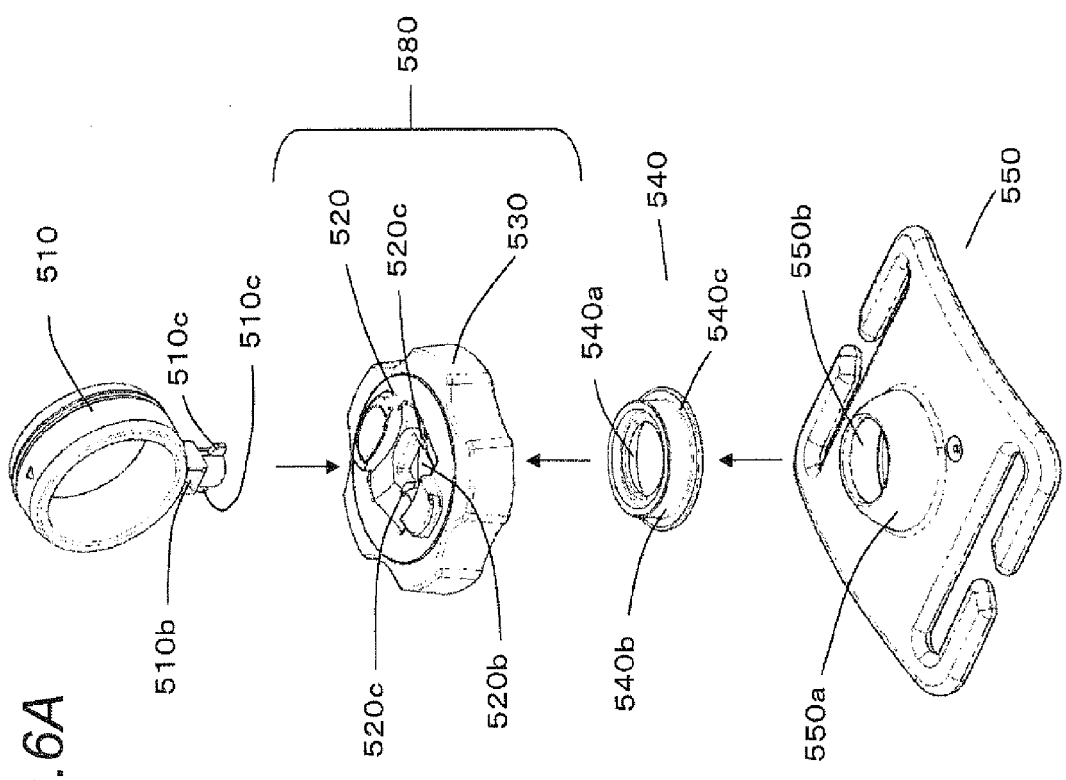
FIG. 6A is a diagram illustrating assembly of the camera holding unit 500.

FIGS. 6A and 6B is a diagram illustrating assembly of the camera holding unit 500. FIG. 6A is a diagram illustrating a flow of assembly of the holding ring 510, the holding nut unit 580, the holding washer bottom 540, and the holding base 550.

At first, the rotation stopper shaped portion 510b of the holding ring 510 is inserted into the rotation stopper hole 520b of the holding washer top 520 such that the rotation stopper shaped portion 510b and the rotation stopper hole 520b contact with each other. In this case, the rotation stopper shaped portion 510b is inserted into the rotation stopper hole 520b such that the protrusions 510c pass through the notches 520c, and thus, any collision of the protrusions 510c with the rotation stopper hole 520b is prevented.

Then, the holding washer bottom 540 is inserted into the holding not unit 530 such that the rib 540c of the holding washer bottom 540 and the rib contact surface 530d of the holding nut unit 530 contact with each other.

Then, the angle adjustment surface 550a of the holding base 550 is made to contact with the angle adjustment surface 540a of the holding washer bottom 540.

Accordingly, as shown in FIG. 6B, the unit is made as an assembly of the holding ring 510, the holding nut unit 580, the holding washer bottom 540, and the holding base 550.

Figure 7B:
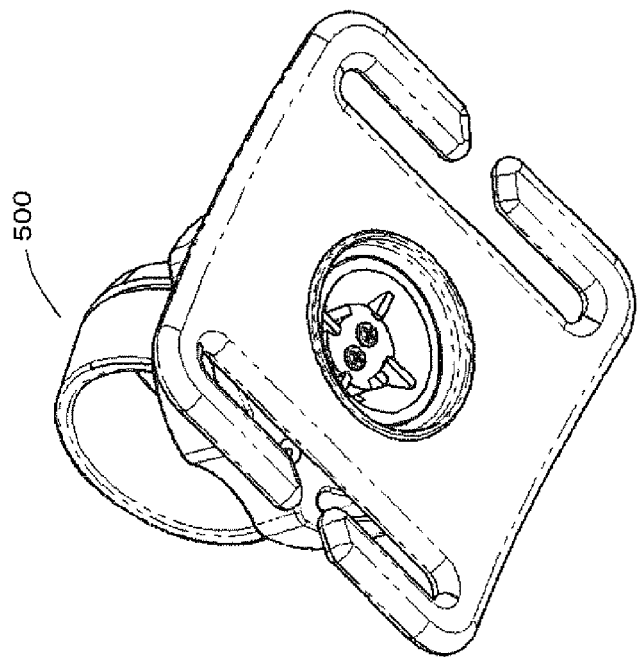
FIG. 7B is a diagram illustrating assembly of a holding ball 560.
Figure 7A:
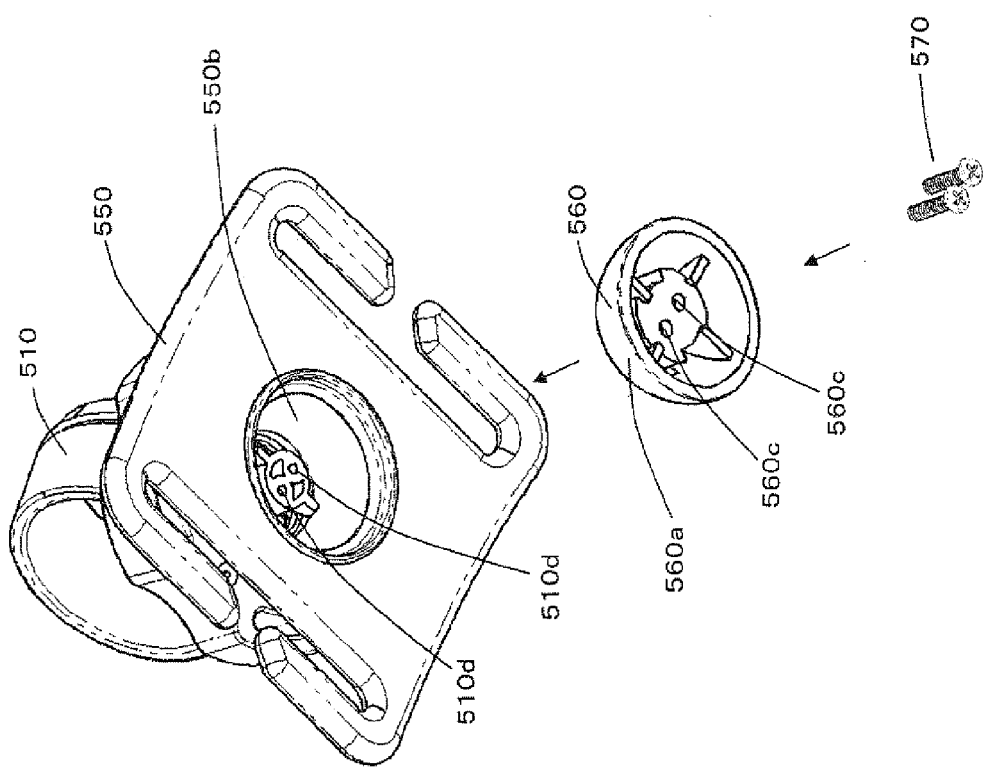
FIG. 7A is a diagram illustrating assembly of a holding ball 560.

FIGS. 7A and 7B is a diagram illustrating assembly of the holding ball 560. A flow of the assembly of the holding ball 560 will be described with reference to FIG. 7A.

At first, the holding ball 560 is inserted into the holding ring 510 such that the protrusions 510c of the holding ring 510 mate with the notches 560b of the holding ball 560. In this case, a surface of the holding ring 510 including screw holes 510d is made to contact with a surface of holding ball 560 including screw holes 560c.

Then, the holding ball 560 is rotated with respect to the holding ring 510 such that the positions of the screw holes 560c and those of the screw holes 510d align with each other. Accordingly, the protrusions 510c of the holding ring 510 contact with the inner wall of the holding ball 560.

Then, the holding ball 560 is fixed to the holding ring 510 by tightening the screws 570 into the screw holes 510d and the screw holes 560c.

In this state, the holding nut unit 530, the holding washer bottom 540, and the holding base 550 are sandwiched by the holding ring 510 and the holding ball 560, and therefore, their positions are limited in the upward and downward directions.

According to the above mentioned flow, the camera holding unit 500 is made as shown in FIG. 7B.

[4. Camera Fixation Operation by Camera Holding Unit]

Figure 8C:
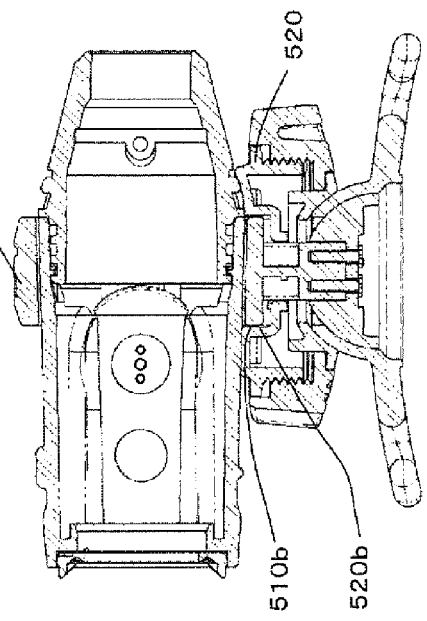
FIG. 8C is a diagram illustrating a holding action of the camera holding unit 500.

Holding action and angle adjustment action for the camera unit 200 by the camera holding unit 500 will be described with reference to FIGS. 8A to 8B.

Figure 8A:
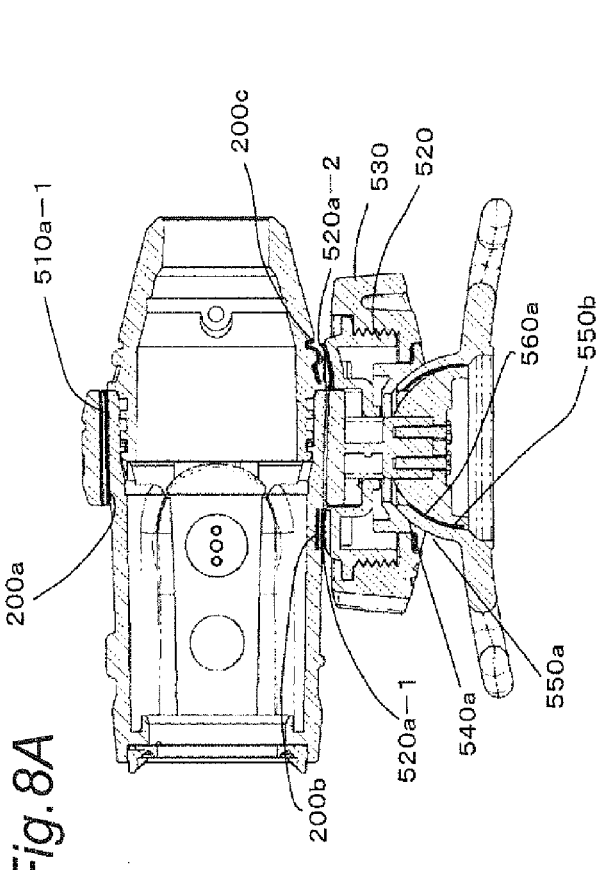
FIG. 8A is a diagram illustrating a holding action of the camera holding unit 500.
Figure 8D:
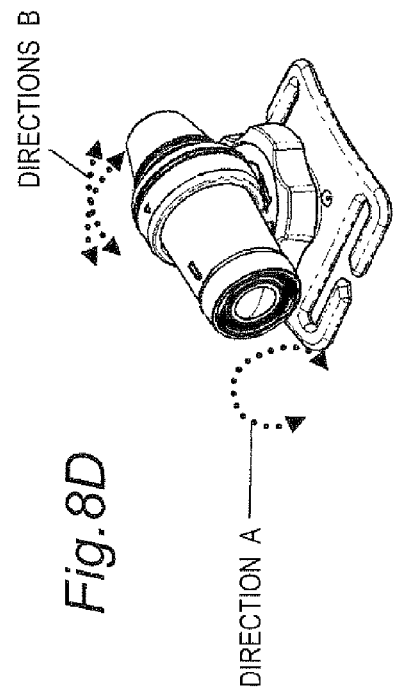
FIG. 8D is a diagram illustrating a holding action of the camera holding unit 500.
Figure 8B:
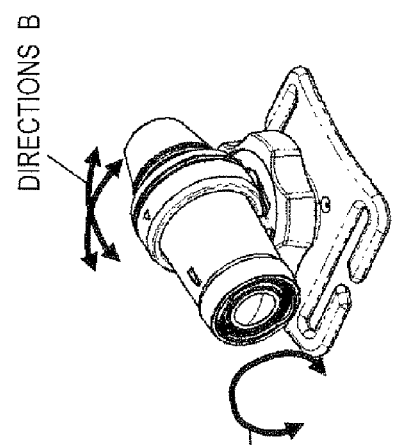
FIG. 8B is a diagram illustrating a holding action of the camera holding unit 500.

FIG. 8A is a cross-sectional diagram of the state where the camera unit 200 is attached to the camera holding unit 500, and the position of the holding washer top 520 is set to be relatively low with respect to than the position of the holding nut 530. FIG. 8B is a diagram illustrating the degree of freedom of the camera unit 200 within the camera holding unit 500 in the state shown in FIG. 8A.

In the state shown in FIG. 8A, there are sufficient gaps between a camera contact surface 510a-1 in the upper portion of the camera mount portion 510a and a corresponding contact surface 200a of the camera 200, between a camera contact surface 520a-1 and a corresponding contact surface 200b of the camera 200, and between a camera contact surface 520a-2 and a corresponding contact surface 200c of the camera 200. Therefore, the camera unit 200 can freely change its angle with respect to the camera holding unit 500 in a direction "A" shown in FIG. 8B.

In the state shown in FIG. 8A, there is no pushing force in the upward and downward directions, among the holding nut 530, the holding washer bottom 540, the holding base 550, and the holding ball 560. Therefore, there are sufficient gaps between the angle adjustment surface 540a and the angle adjustment surface 550a, and between the angle adjustment surface 550b and the angle adjustment surface 560a. Therefore, the camera unit 200 can freely change its angle with respect to the camera holding unit 500 also in directions "B" shown in FIG. 8B, within a range for the rotation stopper shaped portion 510a not to contact with a vertical wall 550c.

FIG. 8C is a cross-sectional diagram of the holding apparatus in the state where the camera unit 200 is attached to the camera holding unit 500, and the position of the holding washer top 520 is set to be relatively high with respect to the position of the holding nut 530. FIG. 8D is a diagram illustrating the degree of freedom of the camera unit 200 within the camera holding unit 500 in the state of FIG. 8C.

When the holding nut 530 is rotated clockwise with respect to the camera unit 200 from the state shown in FIG. 8A by handling the handling portion 530b, the female screw 530a is rotated with respect to the male screw 520d in the direction for the female screw 530a to be loosened, and therefore, the position of the holding washer top 520 moves relatively upward to the position of the holding nut 530. Through this operation, the camera holding unit 500 transitions from the state of FIG. 8A to the state of FIG. 8C. In this case, the rotation stopper shaped portion 510b contacts with the rotation stopper hole 520b, and therefore, the relative rotational positions of the holding ring 510 and the holding washer top 520 are not changed, and the holding ring 510 and the holding washer top 520 move together with each other.

In the state of FIG. 8C, in the upper portion of the camera mount portion 510a, there is no gap between the camera contact surface 510a-1 of the camera contact portion 510a and the camera contacted surface 200a of the camera unit 200. Similarly, in the lower portion of the camera mount portion 510a, there is no gap between the camera contact surface 520a-1 of the camera mount portion 510a and the camera contacted surface 200b of the camera unit 200, and between the camera contact surface 520a-2 and the camera contacted surface 200c. Therefore, these surfaces are pushed to each other in the upward and downward directions, and the position of the camera unit 200 is limited with respect to the cameral holding unit 500 in a direction A of FIG. 8D. In other words, the camera unit 200 is fixed so as not to move in the direction A.

In the state of FIG. 8D, there is no gap between the angle adjustment surface 540a and the angle adjustment surface 550a, and between the angle adjustment surface 550b and the angle adjustment surface 560a, and these surfaces are pushed to each other in the upward and downward directions. Therefore, the position of the camera unit 200 is limited with respect to the camera holding unit 500 also in directions "B" of FIG. 8D.

In the camera holding unit 500, the holding washer top 520 is lifted by rotating the handling portion 530b of the holding nut 530. As the holding washer top 520 is lifted, the camera contact surface 520a is also lifted (upward pushing). The camera unit 200 is sandwiched between the inner wall in the upper portion of the holding ring 510 and the lifted camera contact surface 520a, and thus, held by the holding ring 510. When the holding ring 510 itself can sufficiently hold the camera unit 200, the camera contact surface 520a in contact with the camera unit 200 does not need to be provided in the holding ring 510.

When the lifting of the holding washer top 520 is lifted, the height of an overall assembly of the holding nut 530 and the holding washer top 520 is increased. The inside of the holding washer bottom 540 inserted into the holding nut 530 is strongly pushed against the angle adjustment surface 550*a* of the holding base 550 at the lower portion of the holding washer bottom 540 (downward pushing), and thus, the holding nut 530 is fixed to the holding base 550. The holding washer bottom 540 is inserted in order to reduce the friction between the holding nut 530 and the holding base 550, and is not an essential element. The holding nut 530 may directly contact with the angle adjustment surface 550*a* of the holding base 550, by omitting the holding washer bottom 540.

When the handling portion 530*b* of the holding out 530 is rotated in a direction opposite to that of the holding action of the holding ring 510, the holding force of the holding ring 510 for the camera unit 200 is reduced, and the camera unit 200 becomes rotatable in the direction A. In other words, it becomes possible to adjust the angle of the camera unit 200 in the direction A. In addition, since the pushing force between the holding nut 530 and the holding base 550 is reduced, the camera unit 200 becomes rotatable in the directions B. In other words, it becomes possible to adjust the angle of the camera unit 200 in the directions B.

As described above, according to a first embodiment, the holding nut 530 having the handling portion 530*b* (a third member) is rotated in either direction around a rotation axis on a line from a first object to be pushed and fixed (the holding base 550) to a second object to be pushed and fixed (the camera unit 200). Therefore, the length on the axis from the first object to be pushed and fixed (the holding base 550) to the second object to be pushed and fixed (the camera unit 200) can be reduced, and the size of the overall mechanism for holding the electronic apparatus in the holding apparatus can be reduced.

Figure 9A:
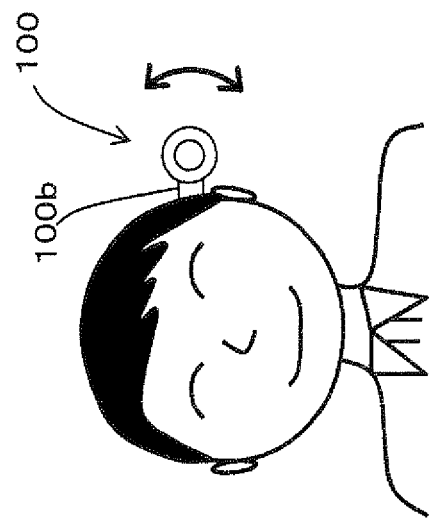
FIG. 9A is a diagram illustrating the state where the camera holding unit 500 is attached.
Figure 9B:
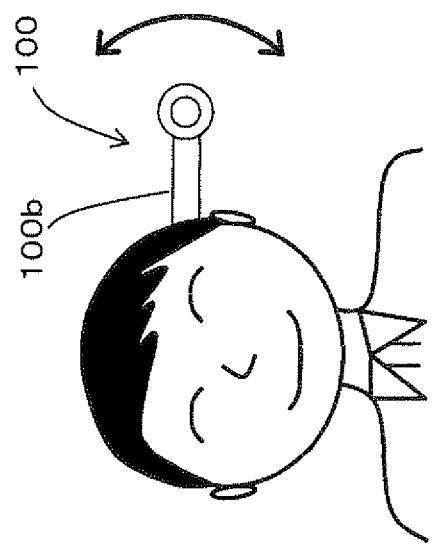
FIG. 9B is a diagram illustrating the state where the camera holding unit 500 is attached.

With reference to FIGS. 9A and 9B, effects achieved by reducing the length on the rotation axis from the first object to be pushed and fixed (the holding base 550) to the second object to be pushed and fixed (the camera unit 200) will be described. FIGS. 9A and 9B is a diagram of the state where a user attaches the wearable camera unit 100 (the camera unit 200, and the camera holding unit 500 holding the camera unit 200) to the user's head.

As shown in FIGS. 9A and 9B, the user uses the wearable camera unit 100 (practically, the camera holding unit 500 holding the camera unit 200) by attaching it to the user's body, clothes, etc. In this case, when the wearable camera unit 100 has a long shaft 100*b*, an even small movement of the user's head results in a large shaky movement of the wearable camera unit 100, as shown in FIG. 9A. Therefore, a significantly blurred image is captured.

On the other hand, when the wearable camera unit 100 has a short shaft 100*b*, the movement of the wearable camera unit 100 resulting from the movement of the user's head is reduced as compared to that of the case in FIG. 9A, as shown in FIG. 9B. Therefore, it is possible capture images with reduced influence from the shaky movement.

According to the wearable camera unit 100 of the first embodiment, it is possible to reduce the length of the shaft of the camera holding unit 500 holding the camera unit 200, and therefore, attach the camera at a reduced distance to the user's head (a portion of the body). In addition, since the length of the shaft is reduced, it is possible to attach the camera at a position closer to the position of the user's eyes, and therefore, capture images closer to those captured from the user's viewpoint. In addition, by rotating the holding nut 530 around the shaft, it is possible to simultaneously limit a first degree of freedom in a first direction (a rolling direction: the direction A shown in FIG. 8B) and a second degree of freedom in second directions (a yawing direction and a pitching direction: the directions B shown in FIG. 8B) for an electronic apparatus.

[5. Summary]

The camera holding unit 500 of this disclosure includes the holding ring (an example of a holding member) 510 that holds the camera unit 200, the holding base (an example of the supporting member) 550 that is connected to the holding ring 510 and supports the holding ring 510, and the holding nut (an example of a first pushing member (that may include the holding washer bottom 540)) 530 and the holding washer top (an example of a second pushing member) 520 which are disposed between the holding ring 510 and the holding base 550. When the holding nut 530 (the handling portion 530*b*) is handled by the user, the holding nut 530 pushes the holding washer top 520 in the first direction toward the holding ring 510, and pushes the holding nut 530 (that may include the holding washer bottom 540) in the second direction toward the holding base 550 and opposite to the first direction. Because of such a configuration, it is possible to reduce the size of the configuration of the camera holding unit 500.

The camera unit 200 is an example of an electronic apparatus. The camera holding unit 500 is an example of the holding apparatus. The holding ring 510 is an example of the holding member. The holding washer top 520 is an example of the second pushing member. The holding nut 530 is an example of the first pushing member. The holding washer bottom 540 is an example of a third pushing member. The holding base 550 is an example of the supporting member.

This disclosure is not limited to a holding apparatus for a camera, and is applicable to a holding apparatus for other apparatuses, such as a speaker apparatus, a microphone apparatus, a lighting apparatus, etc. This disclosure is more effective especially for uses of holding an electronic apparatus, etc., that can be attached to a portion of the body of a user.

The invention claimed is:

1. A holding apparatus of an electronic apparatus, the holding apparatus comprising:
    a holding member that is shaped as a ring into which the electronic apparatus is to be held;
    a supporting member that is connected to the holding member and supports the holding member; and
    a first pushing member and a second pushing member which are disposed between the holding member and the supporting member,
    wherein, when the first pushing member is handled so as to fix the holding member with respect to the supporting member, the first pushing member pushes the second pushing member in a first direction toward the holding member, and the second pushing member pushes the first pushing member in a second direction toward the supporting member and opposite to the first direction,
    wherein the second pushing member comprises at least one contact surface to be in contact with the electronic apparatus.

2. The holding apparatus of an electronic apparatus of claim 1,
    wherein the first pushing member comprises a third pushing member in contact to the supporting member, and
    wherein, when the first pushing member is handled by the user, the first pushing member pushes the third pushing member in the second direction.

3. The holding apparatus of an electronic apparatus of claim 1,
   wherein the first pushing member is rotatable around a rotation axis of the first pushing member, and
   wherein the first pushing member is disposed such that the rotation axis of the first pushing member is in parallel to a direction from the holding member toward the supporting member.

4. The holding apparatus of an electronic apparatus of claim 1,
   wherein the second pushing member is provided with a male screw,
   wherein the first pushing member is provided with a female screw having a shape complement to a shape of the male screw, and
   wherein, when the first pushing member is handled, a height of an overall assembly of the first pushing member and the second pushing member is varied.

5. The holding apparatus of an electronic apparatus of claim 1,
   wherein the supporting member comprises an angle adjustment surface with which an inclination of the holding member is adjusted.

6. The holding apparatus of an electronic apparatus of claim 1,
   wherein the first pushing member is configured to push the second pushing member in the first direction toward the holding member such that a position of the second pushing member moves in the first direction relative to a position of the holding member.

\* \* \* \* \*